United States Patent [19]

Hoelen

[11] 4,130,084
[45] Dec. 19, 1978

[54] COATING APPARATUS

[75] Inventor: Hermanus Josephus Eduardus J. M. Hoelen, Nijmegen, Netherlands

[73] Assignee: Stork Brabant B.V., Boxmeer, Netherlands

[21] Appl. No.: 816,877

[22] Filed: Jul. 18, 1977

[30] Foreign Application Priority Data

Jul. 23, 1976 [NL] Netherlands ............... 7608241

[51] Int. Cl.² .............................................. B05C 3/02
[52] U.S. Cl. ....................................... 118/59; 118/404
[58] Field of Search .................. 118/58.59, 404, 405, 118/407, 503, 305; 269/279, 280; 82/1 NQ; 279/1 NQ; 134/1 NQ; 214/1 P, DIG. 3; 101/1 NQ; 427/356, 358

[56] References Cited

U.S. PATENT DOCUMENTS

| 1,911,124 | 5/1933 | Linder et al. ................... 118/404 |
| 1,949,234 | 2/1934 | Baxter ............................. 118/404 |
| 2,141,852 | 12/1938 | Bingham et al. ............... 118/404 |
| 3,209,723 | 10/1965 | Schrodersecker ........... 118/404 X |

Primary Examiner—Morris Kaplan
Attorney, Agent, or Firm—Edmund M. Jaskiewicz

[57] ABSTRACT

A thinwalled perforated cylinder is coated with a layer of a photo-sensitive substance and subsequently dried by a heating treatment, comprising the steps of securing the cylinder between two mounting heads by means of a detachable accessory part at each of its extreme ends, whereupon an annular receptacle containing a coating fluid is axially moved along the outer periphery of the cylinder and the applied layer is dried by a heated accessory part which, after release of the treated cylinder is conveyed to the other mounting head before a fresh cylinder is mounted.

2 Claims, 3 Drawing Figures

COATING APPARATUS

DISCLOSURE OF THE PRIOR ART

The present invention relates to apparatus for coating a thinwalled perforated cylinder with a photosensitive liquid layer and for subsequently drying this layer by heating. The cylinder is then secured in a vertical position between two mounting heads, whereupon an annular receptacle containing coating fluid is moved along the outer circumference of the cylinder whereafter the applied layer is dried by heating. Such apparatus is described in the U.S. Pat. Application Ser. No. 422,298 filed on Dec. 6, 1973, now abandoned, in which the receptacle is moved during the coating process from the upper to the lower mounting head.

BACKGROUND OF THE INVENTION

In carrying out this process, the required drying treatment of the applied layer presents certain problems because of the heating process required for this purpose. Some proposals for overcoming these problems have previously been made by Applicant but the object of the present invention is a simplification of previous proposals so that the number of additional operations can be reduced to a minimum.

SUMMARY OF THE INVENTION

In the apparatus according to the invention a detachable accessory part is used for securing each extremity of the cylinder to the respective mounting head. During coating of the cylinder at least the accessory part at the end of the coating track, is heated. After the completion of the process, the heated accessory part is then transferred to the other mounting head, before a fresh cylinder is mounted.

As a result of these procedures heat is supplied to the thinwalled perforated cylinder at both ends thereof, namely, at one end by the positively heated accessory part and at the other end by the accessory part which is still hot from the preceding cycle. As a result, the heat penetrates sufficiently into the central part of the cylinder, which is most remote from the mounting heads. As a consequence of the replacement of the accessory part, a fresh accessory part can periodically be put into position at the heating end. The other accessory part can, after having served for the second time, be removed for a possible cleaning treatment.

The invention also relates to an apparatus for coating a cylindrical object with a photo-sensitive layer, comprising a raised or vertical support column, a stationary lower mounting head attached to the support column, an upper mounting head, adjustable for height along the column, a carriage also slidable along the column, for supporting an annular receptacle the center of which lies on the coinciding center lines of both mounting heads and a drive for moving the carriage at a constant speed up and down the column. Such an apparatus is known from U.S. Pat. No. 2,141,852, which relates especially to the coating of a massive printing roller. In order to modify an apparatus of this type for coating a thinwalled perforated cylinder, two detachable accessory parts are provided, each with two slightly conical ends, one of which always fits into an extremity of a cylinder to be mounted while the other end of the accessory part can be secured into the mounting head concerned, heating means being applied to at least one of the mounting heads.

The present invention is also embodied in a detachable accessory part to be applied in the apparatus described above, which accessory part has a cylindrical portion with two slightly conical converging ends, whereby one of the ends has a base with a support piece and some apertures in the conical wall, whereas near the other end a fastening pin protrudes to be mounted upon a central support.

An accessory part shaped in this manner allows on the one hand a fast mounting of the thinwalled perforated cylinder, while on the other hand securing and detaching again of each accessory part to and from the mounting head concerned can easily be performed. The apertures in the accessory part are of importance for tilation of the cylinder in view of the vapours, liberated during the coating process.

SURVEY OF THE DRAWINGS

DESCRIPTION OF A PREFERRED EMBODIMENT

Figure 1:
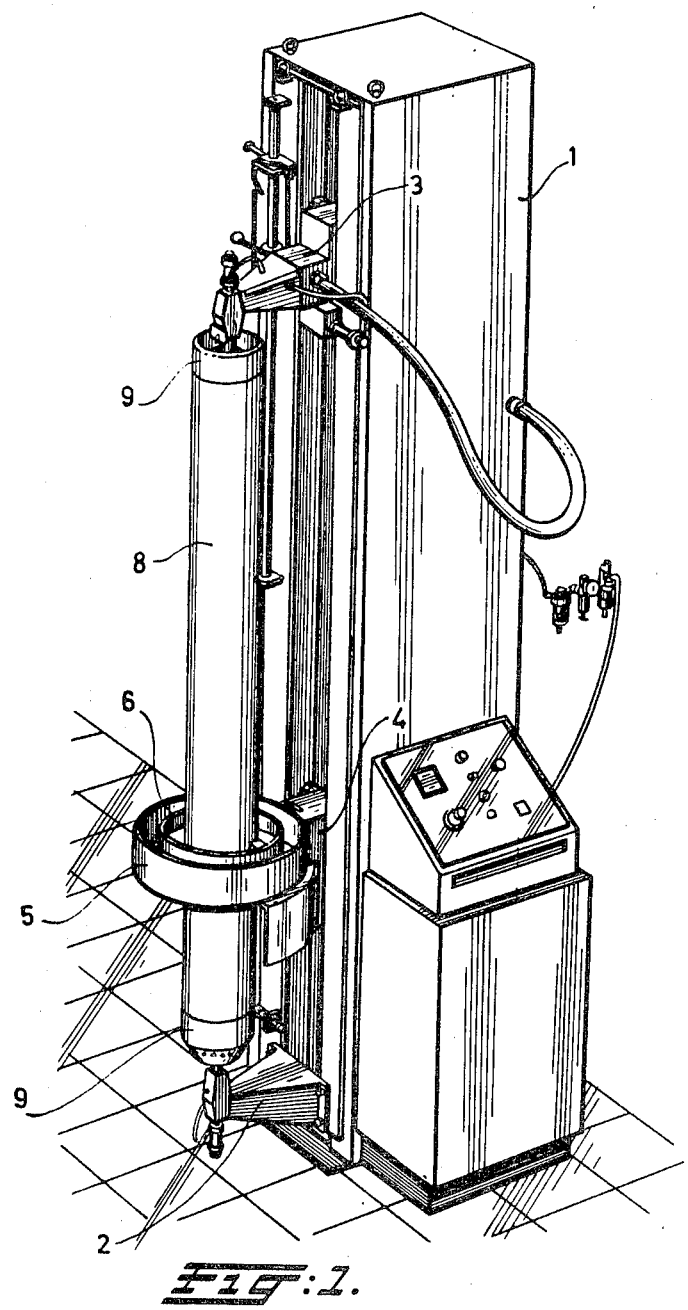
FIG. 1 shows an overall perspective view of the apparatus.

FIG. 1 shows the apparatus according to the invention with a raised or vertical support column 1, to which three elements are attached. The first element is a stationary lowermost mounting head 2, which is immovably secured in column 1. The second element is an uppermost mounting head 3, adjustable for height along column 1. The heads 2 and 3 are installed opposite one another in such a way, that an imaginary vertical center line going through the end of one head coincides with the center line of the other head. The third element is a movable carriage or sled 4 onto which an annular holder 5 and an annular receptacle 6 can be affixed. The center of this receptacle lies on the coinciding center line 7 of the two mounting heads 2 and 3.

The adjusting mechanism of the upper mounting head 3 within the column 1 is principally constructed similar to the mechanism that is described in the U.S. Pat. No. 2,141,852 mentioned hereinbefore. The drive for moving the carriage 4 at a constant speed up and down the column 1 can be performed by means of a chain, within the column, as also described in the above mentioned Patent Specification. This drive is performed in such a way that the downwardly directed speed of the carriage 4 and thus of the annular holder 5 connected therewith is in the order of magnitude of 12 cm/min, while the upward speed can be approximately nine times faster.

Figure 3:
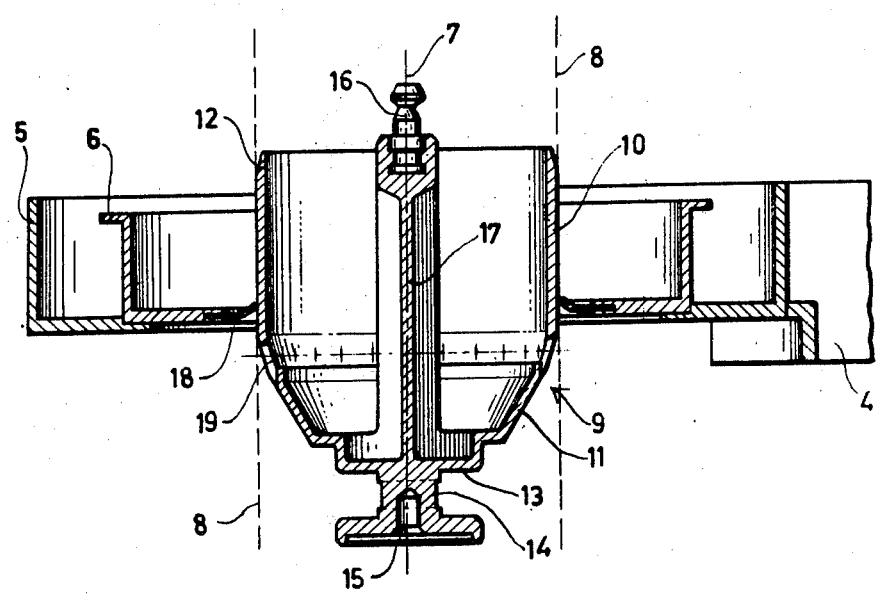
FIG. 3 shows a longitudinal section on an enlarged scale of an accessory part.

Between the heads 2 and 3 a thinwalled perforated cylinder 8 is to be mounted. For this purpose a detachable accessory part 9, is used, as illustrated in FIG. 3 on an enlarged scale. This accessory part has a cylindrical portion 10, adjoined at both ends by slightly conical parts 11 and 12. The lowermost end 11 converges onto a base 13, which is integral with a support piece 14. The underside of this support piece comprises a centering opening 15. Near the other end of the accessory part 9 a fastening pin 16 is cast on a central rod 17. The lowermost mounting head 2 is provided with a pin (not shown) that fits in the opening 15 of the support piece 14. The upper mounting head 3 has a quick-acting coupling (not shown) that coacts with the pin 16. The fixed lower head 2 is provided with heating means (not shown) the purpose of which will be described hereinafter.

The following description of the process includes two different phases which should be distinguished, namely:

putting the apparatus, into operation, that is to say to secure a thinwalled perforated cylinder 8 (for example a screen stencil) for the first time;

replacing a coated cylinder by another cylinder to be coated.

In the first phase use is made of an accessory part 9 the support piece 14 of the accessory part is placed upon the pin of the lower (heatable) mounting head 2. The carriage 4 is, together with the holder 5, conveyed to its lowest position, as is shown in FIG. 3. The annular receptacle 6 is then slid over the accessory part 9 until the receptacle rests upon the holder 5. The receptacle 6 is provided with an annular squeegee 18, that fits about the cylindrical portion 10 of the accessory part 9. Thereupon the coating fluid (a lacquer) is poured into the receptacle 6, while at the same time the accessory part 9 is heated. Subsequently the carriage 4 with holder 5 is moved rapidly upwards, whereby the accessory part 9 is also carried along.

As soon as the assembly of the carriage 4, the holder 5, the receptacle 6 and the accessory part 9 has cleared sufficiently above the lower head 2, a new accessory part 9 is placed upon the lower head 2. When the aforementioned assembly 4, 5, 6, 9 has come near the upper level the pin 16 on accessory part 9 will engage the quick-acting coupling of the upper mounting head 3. This head then moves further upwards with the assembly mentioned, over a short distance, until the upper level is reached (see FIG. 2). At that moment a cylinder 8 is placed upon the lower accessory part 9, which cylinder 8 then rests upon the conical region 12 of said lower accessory part. Hereafter the carriage 4 together with accessory part 9 and mounting head 3 move downwards with a low speed as mentioned before. Consequently the uppermost end of the cylinder 8 to be coated receives the conical portion 11 of the upper accessory part 9, so that this accessory part with mounting head 3 comes to a standstill. The carriage 4 moves further downwards so that the squeegee 18 slides along the cylindrical portion 10 of the upper accessory part 9 and subsequently along the cylinder 8, which is thus coated with a thin layer of the liquid, contained in the receptacle 6.

As a consequence of the pre-heating of the upper accessory part 9 and the heating of the lower accessory part by means of the lower mounting head 2, the thin-walled perforated cylinder 8 will also be heated, so that the applied fluid layer will dry quickly. The coating process of the cylinder 8 will be completed as soon as the carriage 4 with the holder 5 and the receptacle 6 are positioned around the cylindrical portion 10 of the lower accessory part 9. The upper mounting head 3 can subsequently be moved upwards for clearing the upper end of the cylinder 8. Said cylinder can then be detached together with the upper accessory part 9 from the quick-acting coupling in order to be subsequently cleaned, if necessary. At this stage the first phase of putting the apparatus according to the invention into operation is completed.

The following, continually recurring second phase of the use of the apparatus according to the invention is only distinguished from the before described first phase by the following points: the accessory part 9 supported on the lower mounting head 2, which was already used once when performing the process, is now utilised for the second time. This is because this accessory part is moved upwards by the carriage 4, the holder 5 and the receptacle 6, together with the squeegee 18 at an increased speed. At the end of this movement the fastening pin 16 is seized again by the quick-acting coupling of the upper mounting head 3. The concerned accessory part 9 still experiences the influence of the heating during the first phase. In the mean time another accessory part 9 is placed upon the lower mounting head 2, whereafter a cylinder 8 is mounted again between the two accessory parts 9 and the process is repeated. In accordance with the first phase, the thin-walled perforated cylinder 8 is heated from both its ends, thus causing a fast drying of the applied layer. It should be noted that a heating temperature up to 55° C. (102° F.) is sufficient to achieve a fast drying and thus a shortening of the so-called sticky stage. The cycle just described is repeated as long as there are cylinders 8 available to be coated.

It is essential, that the holder 5 and the receptacle 6 with the squeegee 18 are positioned on the cylindrical portion 10 of the accessory part 9 before and after coating of the cylinder. Due to this feature, a cylinder 8 can be mounted or removed and no leakage of the liquid in receptacle 6 can occur.

From the above description it can be seen that a fresh accessory part 9 is constantly placed upon the lower mounting head 2 and that this accessory part, after having served as a support for the lower end of the cylinder 8, is subsequently moved upwards in order to serve then as a support for the upper end of the next cylinder 8. Hereinafter this accessory part is removed for cleaning and renewed use at the location of the lower head 2. In the accessory part 9 some apertures 19 ventilate the interior of the cylinder 8 mounted between two parts 9.

Figure 2:
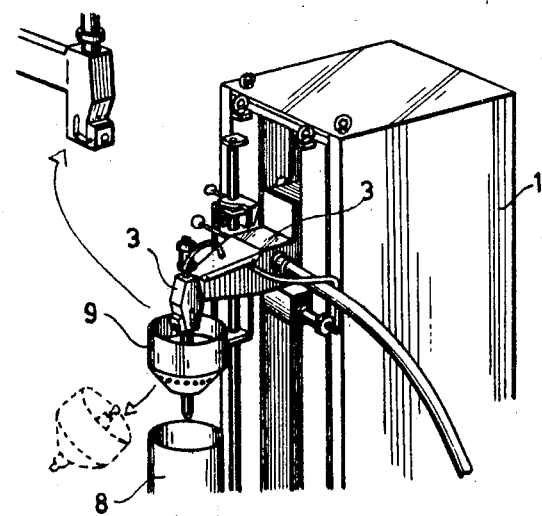
FIG. 2 shows in perspective the upper part of the apparatus during the replacement of an accessory part.

It is also apparent that a cylinder 8 can also be coated the other way round, that is from below in an upward direction opposite the direction shown in FIGS. 1 and 2. In that case at least the upper mounting head 3 is heated while after completion of the coating treatment, the assembly 4, 5, 6 and 9 is moved downwards, at an increased speed and a new accessory part 9 is positioned on the upper head 3. It is also possible to provide both mounting heads with heating means.

What is claimed is:

1. An apparatus for coating a thin-walled perforated cylinder, particularly a screen stencil, with a photo-sensitive liquid layer comprising a vertical support column, a stationary lower mounting head attached to said support column, an upper mounting head adjustable for height along said column above said lower head, a carriage slidable along said column between said mounting heads, an annular receptacle attached to said carriage and movable therewith, the center of said annular receptacle coinciding with the center lines of both mounting heads, a drive means on said column for moving said carriage at a constant speed up and down along said column between said mounting heads, a pair of detachable accessory parts each having two conical ends, one conical end of each accessory part receiving a separate end of a said perforated cylinder and means projecting from the other conical end of each accessory part being mounted on an associated one of said mounting heads, said one conical end having a projecting means adapted to detachably mount on the second of said heads whereupon the said other conical end is adapted to be received by a said perforated cylinder, said annular receptacle comprising a reservoir for said liquid and being operatively associated with a said perforated cylinder which is supported by said pair of parts whereby to coat said cylinder upon movement of the carriage, and means for heating at least one of said mounting heads.

2. An apparatus as in claim 1 wherein each said detachable part comprises a cylinder, said conical ends are slightly convergent with one of said ends having apertures therein, and wherein the projecting means associated with said apertured end is configured as a broad base support.

* * * * *